(12) United States Patent
Jeganathan et al.

(10) Patent No.: US 7,320,632 B2
(45) Date of Patent: Jan. 22, 2008

(54) METHOD OF PRODUCING A LAMP

(75) Inventors: Balu Jeganathan, Rowville (AU); John Albert Montagnat, East Ringwood (AU)

(73) Assignee: Lednium Pty Limited, Chatsworth (AU)

( * ) Notice: Subject to any disclaimer, the term of this patent is extended or adjusted under 35 U.S.C. 154(b) by 0 days.

(21) Appl. No.: 10/305,294

(22) Filed: Nov. 26, 2002

(65) Prior Publication Data

US 2003/0151343 A1  Aug. 14, 2003

Related U.S. Application Data

(63) Continuation of application No. PCT/AU02/00780, filed on Jun. 14, 2002, and a continuation-in-part of application No. 10/049,572, filed as application No. PCT/AU01/00717 on Jun. 15, 2001, now Pat. No. 6,809,475.

(30) Foreign Application Priority Data

Jun. 15, 2000  (AU)  ................. PQ8181/00
Jun. 15, 2001  (AU)  ................. PR5705/01

(51) Int. Cl.
*H01J 9/00*  (2006.01)

(52) U.S. Cl. ........................ 445/24; 313/512
(58) Field of Classification Search ........ 313/501–512; 362/800; 445/23–25
See application file for complete search history.

(56) References Cited

U.S. PATENT DOCUMENTS

| | | |
|---|---|---|
| 3,581,162 A | 5/1971 | Wheatley |
| 3,763,405 A | 10/1973 | Mitsuhata |
| 3,875,456 A | 4/1975 | Kano et al. |
| 3,886,581 A | 5/1975 | Katsumura et al. |
| 3,886,681 A | 6/1975 | Katsumura et al. |
| 4,054,814 A * | 10/1977 | Fegley et al. ................. 315/71 |
| 4,173,035 A | 10/1979 | Hoyt |
| 4,255,688 A | 3/1981 | Nagasawa |
| 4,271,408 A | 6/1981 | Teshima et al. |
| 4,467,193 A | 8/1984 | Carroll |
| 4,473,834 A | 9/1984 | Soclof |
| 4,703,219 A | 10/1987 | Mesquida |
| 4,851,824 A | 7/1989 | Murata |
| 4,878,107 A | 10/1989 | Hopper |
| 4,893,223 A | 1/1990 | Arnold |
| 4,935,665 A | 6/1990 | Murata |
| 4,975,814 A | 12/1990 | Schairer |

(Continued)

FOREIGN PATENT DOCUMENTS

DE  34 38 154 A1  4/1986

(Continued)

OTHER PUBLICATIONS

Mar. 24, 2005 Office Action from co-pending U.S. Appl. No. 10/953,797, entitled LED Lamp, filed Sep. 29, 2004.

(Continued)

*Primary Examiner*—Joseph Williams
(74) *Attorney, Agent, or Firm*—Knobbe Martens Olson & Bear, LLP

(57) ABSTRACT

A method of producing a lamp is disclosed. The method provides for mounting light emitting junctions on a support structure such that the junctions adopt a three-dimensional array.

36 Claims, 15 Drawing Sheets

U.S. PATENT DOCUMENTS

| | | | |
|---|---|---|---|
| 5,055,892 A | 10/1991 | Gardner et al. | |
| 5,084,804 A | 1/1992 | Schairer | |
| 5,119,174 A | 6/1992 | Chen | |
| 5,218,233 A | 6/1993 | Takahashi | |
| 5,289,082 A | 2/1994 | Komoto | |
| 5,373,280 A | 12/1994 | Louy et al. | |
| 5,404,282 A | 4/1995 | Klinke et al. | |
| 5,455,199 A | 10/1995 | Sakamoto | |
| 5,515,253 A | 5/1996 | Sjobom | |
| 5,519,596 A * | 5/1996 | Woolverton | 362/250 |
| 5,534,718 A | 7/1996 | Chang | |
| 5,561,346 A | 10/1996 | Byrne | |
| 5,594,424 A | 1/1997 | Louy et al. | |
| 5,709,453 A | 1/1998 | Krent et al. | |
| 5,959,316 A | 9/1999 | Lowery | |
| 5,962,971 A | 10/1999 | Chen | |
| 5,998,925 A | 12/1999 | Shimizu | |
| 5,999,151 A | 12/1999 | Michael | |
| 6,068,383 A | 5/2000 | Robertson et al. | |
| 6,331,063 B1 | 12/2001 | Kamada et al. | |
| 6,367,949 B1 | 4/2002 | Pederson | |
| 6,409,938 B1 | 6/2002 | Comanzo | |
| 6,412,971 B1 | 7/2002 | Wojnarowski et al. | |
| 6,521,916 B2 | 2/2003 | Roberts et al. | |
| 6,599,000 B2 | 7/2003 | Nolan | |
| 6,809,475 B2 | 10/2004 | Jeganathan et al. | |
| 6,961,190 B1 | 11/2005 | Tamaoki et al. | |
| 2002/0006040 A1 | 1/2002 | Kamada et al. | |
| 2002/0042156 A1 | 4/2002 | Chen | |
| 2002/0101157 A1 | 8/2002 | Suehiro | |
| 2002/0113244 A1 | 8/2002 | Barnett et al. | |
| 2003/0107316 A1 | 6/2003 | Murakami et al. | |
| 2003/0151343 A1 | 8/2003 | Jeganathan et al. | |
| 2005/0104515 A1 | 5/2005 | Jeganathan et al. | |
| 2005/0285505 A1 | 12/2005 | Jeganathan et al. | |

FOREIGN PATENT DOCUMENTS

| | | |
|---|---|---|
| DE | 4107526 | 10/1991 |
| DE | 4124413 | 1/1993 |
| DE | G 93 16 108.9 | 3/1993 |
| DE | 20007730 U1 | 9/2000 |
| DE | 199 22 176 A1 | 11/2000 |
| DE | 200 13 605 U1 | 12/2000 |
| DE | 20110289 | 6/2001 |
| DE | 100 25 563 | 12/2001 |
| EP | 0107480 | 5/1984 |
| EP | 0303741 | 2/1989 |
| EP | 0354468 | 2/1990 |
| EP | 0364806 | 1/1993 |
| EP | 0921568 | 11/1998 |
| EP | 1098373 | 5/2001 |
| EP | 1 213 773 A1 | 6/2002 |
| FR | 2198675 | 3/1974 |
| FR | 2290721 | 6/1976 |
| FR | 2518317 A1 | 6/1983 |
| FR | 2588109 | 4/1987 |
| FR | 2 707 222 A1 | 1/1995 |
| FR | 2779508 | 12/1999 |
| GB | 2311126 | 9/1997 |
| GB | 2348324 | 9/2000 |
| GB | 2356037 | 5/2001 |
| GB | 2361581 A | 10/2001 |
| JP | 61032483 | 2/1986 |
| JP | 61-141165 A | 6/1986 |
| JP | 11261114 | 11/1991 |
| JP | 06-222722 | 8/1994 |
| JP | 08162672 | 6/1996 |
| JP | 11163411 | 11/1997 |
| JP | 10200168 | 7/1998 |
| JP | 10-242523 | 9/1998 |
| JP | 10269822 | 10/1998 |
| JP | 11026816 | 1/1999 |
| JP | 11162231 | 6/1999 |
| JP | 11162232 | 6/1999 |
| JP | 11163412 | 6/1999 |
| JP | 11177144 | 7/1999 |
| JP | 2000-252524 | 9/2000 |
| JP | 2002-245812 | 8/2002 |
| JP | 2002-336275 A | 11/2002 |
| JP | 2003-31005 A | 1/2003 |
| NL | DT 2361531 | 12/1987 |
| NL | G 93 16 106.9 | 10/1993 |
| TW | 408497 | 10/2000 |
| WO | WO97/12386 A2 | 4/1997 |
| WO | WO002261 | 1/2000 |
| WO | WO 0002261 | 1/2000 |
| WO | WO0057490 | 9/2000 |
| WO | WO 0057490 | 9/2000 |
| WO | WO 01/08228 A1 | 2/2001 |
| WO | WO 0133640 | 5/2001 |
| WO | WO133640 | 5/2001 |
| WO | WO 0150540 | 7/2001 |
| WO | WO0150540 | 7/2001 |
| WO | WO 01/97287 A1 | 12/2001 |
| WO | WO 2002/091489 | 11/2002 |
| WO | WO 2002/103794 A1 | 12/2002 |
| WO | WO 2003/056636 | 7/2003 |
| WO | WO 2003/107423 | 12/2003 |

OTHER PUBLICATIONS

PCT International Search Report, App. No. PCT/AU01/00717, App. Date: Jun. 15, 2001.

Office Action of Sep. 21, 2005 for U.S. Appl. No. 10/953,797, filed Sep. 29, 2004 (LEDNI.001C2).

OA Mar. 22, 2005 fr co-pending U.S. Appl. No. 10/305,294 Method of Producing a Lamp; filing date: Nov. 26, 2002.

Aug. 9, 2006 OA fr co-pending U.S. Appl. No. 10/953,797, LED Lamp, filed Sep. 29, 2004 (LEDNI.001C2).

English-language Abstract for JP 57 156 442.

PCT International Search Report, App. No.: PCT/AU03/00724, Date: Jun. 11, 2003.

PCT International Search Report, App. No.: PCT/AU2004/000283, Date: Mar. 5, 2004.

Suupl. European Search Report, EP 01942891, Date: Aug. 2, 2006.

U.S. Appl. No. 10/953,797, filed Sep. 29, 2004, Jeganathan et al.

U.S. Appl. No. 10/487,040, filed Jun. 12, 2002, Jeganathan et al.

U.S. Appl. No. 10/548,498, filed Sep. 9, 2005, Jeganathan et al.

Suppl. European Search Report, EP 03727013, Date: Sep. 13, 2006.

Supplemental European Search Report, EP 02 72 9655, Date: Feb. 7, 2007.

Office Action dated Mar. 8, 2007 from co-pending U.S. Appl. No. 10/953,797, entitled Led Lamp With Light-Emitting Junctions Arranged in Three-Dimensional Array; filed Sep. 29, 2004. (LEDNI.001C2).

* cited by examiner

METHOD OF PRODUCING A LAMP

CROSS-REFERENCE TO RELATED APPLICATIONS

This application is a continuation of International Patent Application PCT/AU02/00780 filed in English on Jun. 14, 2002, which claims priority to Australian Patent Application PR5705/01 filed on Jun. 15, 2001; and is a continuation-in-part of U.S. patent application Ser. No. 10/049,572 filed on Feb. 14, 2002, now U.S. Pat. No. 6,809,475 which is the entry into the National Phase, under 35 U.S.C. § 371, of International Patent Application PCT/AU01/00717 filed on Jun. 15, 2001 and published in English as WO 0197287, which claims priority to Australian Patent Application PQ8181/00 filed on Jun. 15, 2000.

FIELD OF THE INVENTION

The present invention relates to a method of producing a lamp, particularly an LED lamp, and a lead frame for use in the lamp.

SUMMARY OF THE INVENTION

In accordance with the present invention, there is provided a method of producing a lamp. The method of the present invention provides for mounting light emitting junctions on a support structure such that the junctions adopt a three-dimensional array.

Preferably, the method further comprises locating the junctions in respective recesses formed in the support structure, the recesses functioning as an optical guide for controlling a direction of light output from the associated junction.

Preferably, the support structure comprises a plurality of conductors and the method further includes forming the conductors in a curved configuration, which is preferably a part spherical configuration.

Preferably, the conductors are provided in the form of a lead frame.

Preferably, the method further comprises moving the lead frame relative to a forming station and engaging a punch and die, from opposed sides of the lead frame, to form the recesses. The recesses may be formed in a single action or, alternatively, formed sequentially, with the punch and die being moved relative to the lead frame after each recess forming action so that the punch and die are appropriately positioned for a subsequent recess forming action.

Preferably, the lead frame is supported on a carrier and the method comprises moving the carrier so as to present each recess to a mounting station whereat the junctions are mounted to the conductors. The carrier is preferably rotatable about first and second orthogonal axes to align the respective recess with the mounting station and the junctions are mounted in the respective recesses by advancing the junctions and associated conductors relative to each other along a third axis, which is preferably orthogonal to the first and second axes.

Each junction is preferably electrically connected to two of the conductors via intermediate conductors. The intermediate conductors may be connected to allow for independent control of at least two of the junctions, by controlling electric current through the associated conductors, to which each junction is connected. The junctions may further be electrically coupled to the conductors in groups which are separately controllable.

The method preferably comprises application of a common phosphor over at least two adjacent junctions and, more preferably, encapsulation of the support structure and junctions, in a globe portion.

In another aspect, there is provided a lead frame comprising a plurality of conductors formed in a curved configuration, for supporting light emitting junctions in a three-dimensional array. The lead frame preferably includes recesses for receipt of a respective one of the junctions.

In another aspect, there is provided a lamp formed in accordance with the above-described method.

In yet another aspect, there is provided a method of operating the above described lamp, formed with conductors and light emitting junctions electrically connected therebetween, including controlling electrical current through individual ones of the conductors so as to independently control light output from the junctions coupled thereto.

BRIEF DESCRIPTION OF THE DRAWINGS

The invention will be described in more detail with reference to the drawings in which.

DETAILED DESCRIPTION OF A PREFERRED EMBODIMENT

Figure 1:
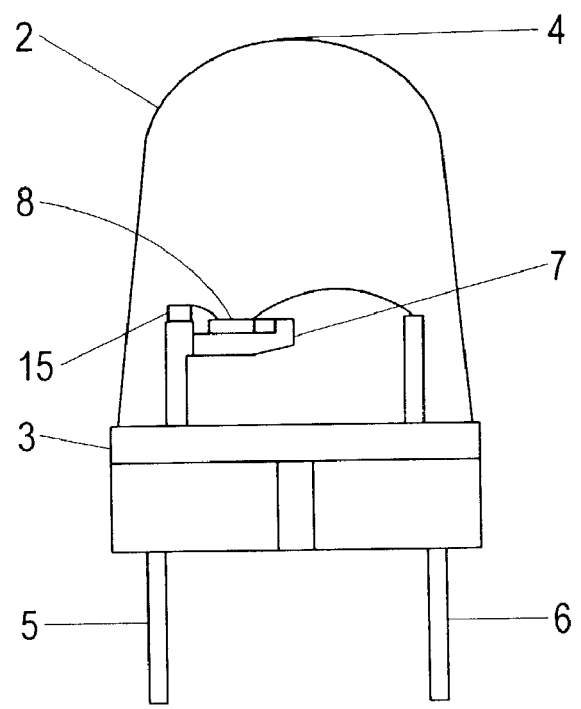
FIG. 1 is a side-view of an LED lamp.
Figure 3:
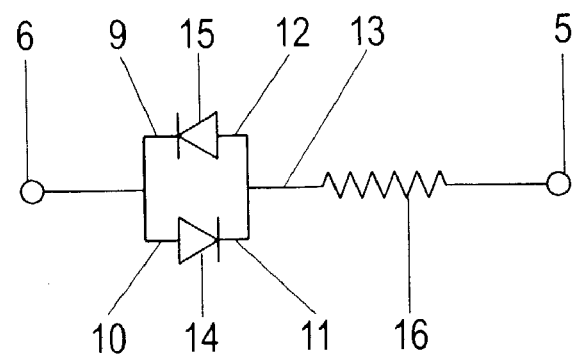
FIG. 3 is a circuit diagram for the lamp of FIGS. 1 and 2.

In accordance with an exemplary embodiment of the present invention, the lamp 1, as shown in FIG. 1, includes a globe portion 2 with a cylindrical base 3 and a parabolic end 4, configured to enhance illumination output in an axial direction of the lamp. The lamp also includes first and second terminals, which are preferably in the form of conductors 5, 6 which are embedded within the globe portion 2. The terminal 5 has a support platform 7 to which is mounted an integrated circuit wafer 8. In the example given, the wafer includes two junctions which are arranged substantially adjacent to each other so that a common layer of fluorescent material, such as a phosphor layer, may be applied over both junctions. Intermediate conductors 9 to 12 electrically couple the junctions to the respective terminals 5, 6 so that the LED junctions 14, 15 are arranged in reverse polarity, as indicated in the circuit diagram FIG. 3. A resistive element 16 is provided between a further conductor 13 (connecting the intermediate conductors 11 and 12) and the terminal 5.

The conductors 5, 6, intermediate conductors 9 to 13, and wafer 8 are all embedded within the globe portion 2 so that the lamp is presented as a robust unitary structure. The reverse polarity of the junctions allows the lamp to be connected to a power source without concern for polarity, as compared to the case with a conventional LED arrangement. The use of a single phosphor layer, common to each of the junctions, also simplifies manufacture and provides an aesthetic advantage in that the light from either junction is perceived to originate from a single source.

Figure 7:
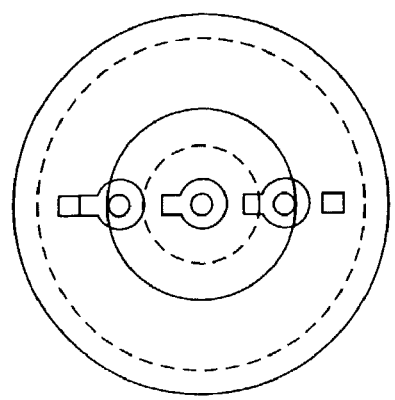
FIG. 7 is a plan view of the lamp of FIG. 4.
Figure 4:
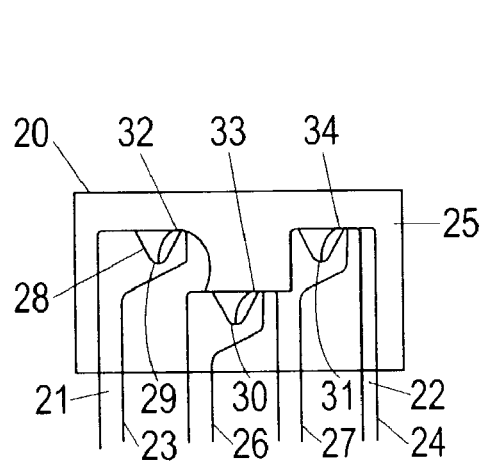
FIG. 4 is a diagrammatic cross-sectional view of a second LED lamp.

In a preferred form of the LED lamp, the following specifications may apply:

positioning the junctions 29, 30, 31 before application of the phosphor layer 35 within and before application of the globe portion 25. As can be seen from both FIGS. 6 and 7, the junctions 29, 30, 31 are preferably arranged in a generally linear array, with the conductors 23, 27 projecting above the conductor 26 so that the overall illumination generated by the junctions will be somewhat enhanced on-axis, as represented in FIG. 8 by curve A.

Figure 8:
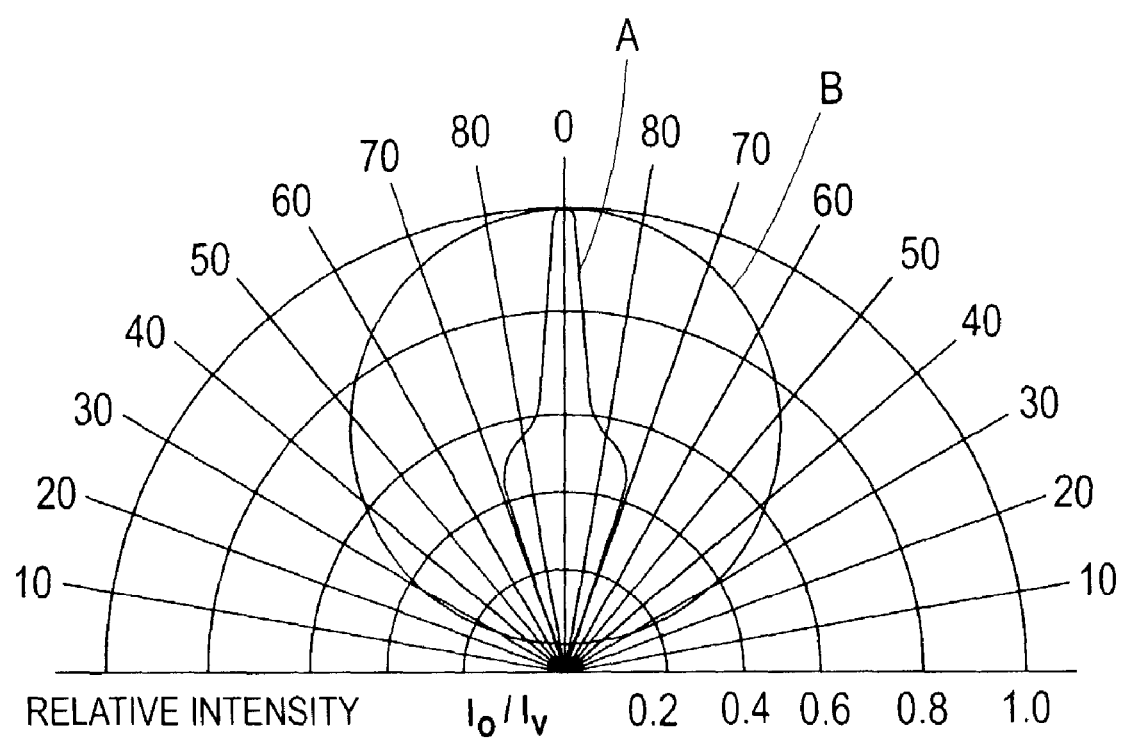
FIG. 8 is a representation of an illumination pattern of the lamp of FIGS. 4 to 7.
Figure 13:
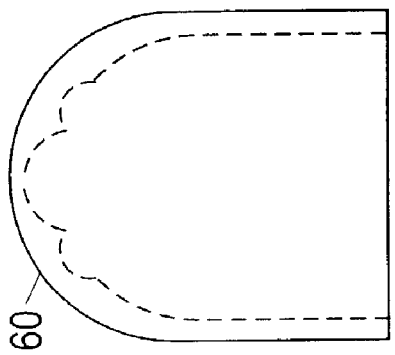
FIG. 13 is a side view of a lens for fitting on the lamp of FIG. 9.

In another exemplary embodiment, the lamp 20 may also be provided with a lens 41 which is fitted to the globe portion 25 and shaped so as to modify the light generated by the lamp to produce, for example, the illumination pattern represented by curve B in FIG. 8, whereby the output illumination is somewhat more evenly distributed.

Turning now to FIGS. 9 to 16, in another exemplary embodiment, a third lamp 50 is illustrated. Again, the lamp 50 is in general similar to the previous lamp construction insofar as a plurality of conductors 51,52,53 and 54 are embedded within a unitary globe portion 55 and have light emitting junctions 56 mounted in respective recesses 57 and covered by a common layer of fluorescent material 59. Each junction is again electrically coupled to the respective conductor to which it is mounted and an adjacent conductor via intermediate conductors 58 so as to form the circuit illus-

| | |
|---|---|
| NOMINAL SIZE- | 9.5 mm diameter |
| LIGHT COLOUR- | WHITE |
| GLOBE COLOUR- | WATER CLEAR |
| LIGHT INTENSITY- | SUPERBRIGHT |
| | TYPICAL LIGHT OUTPUT > 500 mCd @ 20 mA |
| GUARANTEED LIFE- | 30,000 HOURS |
| FOCUS- | HALF ANGLE 15° typ. |
| BASE STYLE- | INTERCHANGEABLE WITH WEDGE TYPE LAMPS |
| LEAD DIMENSIONS- | 6 mm nom. OUTSIDE BASE WEDGE |
| SUPPLY VOLTAGE- | 12 VOLTS nom. (> 11.5 < 14 volts AC or DC} |
| FORWARD CURRENT- | 20 + 8/− 3 mA @12 Volts |
| FORWARD VOLTAGE- | 3.6 min(typ) 4.0 max. @ 20 mA |
| REVERSE VOLTAGE- | 5 Volts min. |
| POWER DISSIPATION- | LED JUNCTIONS 120 Mw |
| | RESISTOR 170 mW |
| REVERSE CURRENT- | $50 \times 10^{-3}$ mA max. @ 5 V |
| INTERNAL RESISTOR- | 430 ohms nom. |

It should, however, be appreciated that the size configuration and operating parameters of any of the component parts of the lamp may vary, as required and the number of LED junctions may also be increased to suit illumination needs.

Figure 2:
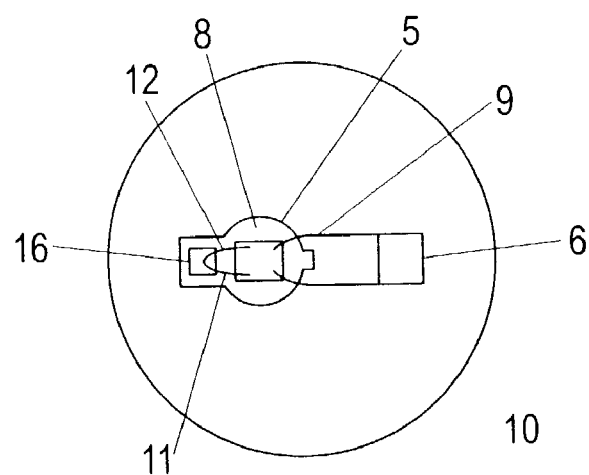
FIG. 2 is a plan-view of the lamp of FIG. 1.

An exemplary embodiment of a second lamp 20 is now described with reference to FIGS. 4 to 8. The lamp 20 is generally similar in construction to that of FIGS. 1 to 3, in sofar as first and second terminals 21 and 22 are provided, in the form of conductors 23, 24 embedded in a globe portion 25, together with additional conductors 26, 27. Each of the conductors 23, 26 and 27 have a respective recess 28, to provide support structure for receiving an associated junction, indicated by reference numerals 29, 30, 31. The junctions are covered by a common layer of phosphor 35 and are electrically coupled between each respective conductors 23, 26, 27 to which they are mounted, and the adjacent conductor via intermediate conductors 32, 33, 34. In the example shown, the junctions are serially connected, as represented by the circuit diagram of FIG. 5.

Figure 6:
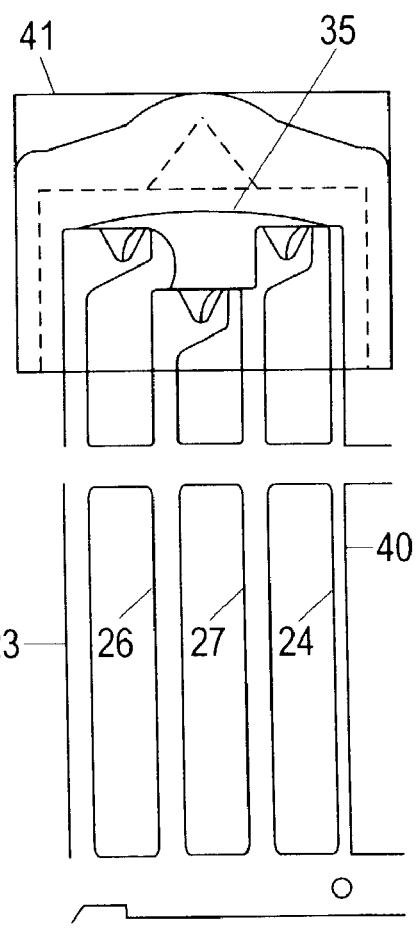
FIG. 6 is a cross-sectional view of the lamp of FIG. 4.
Figure 5:
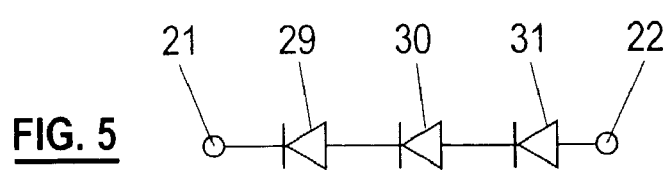
FIG. 5 is a circuit diagram of the lamp of FIG. 4.
Figure 10:
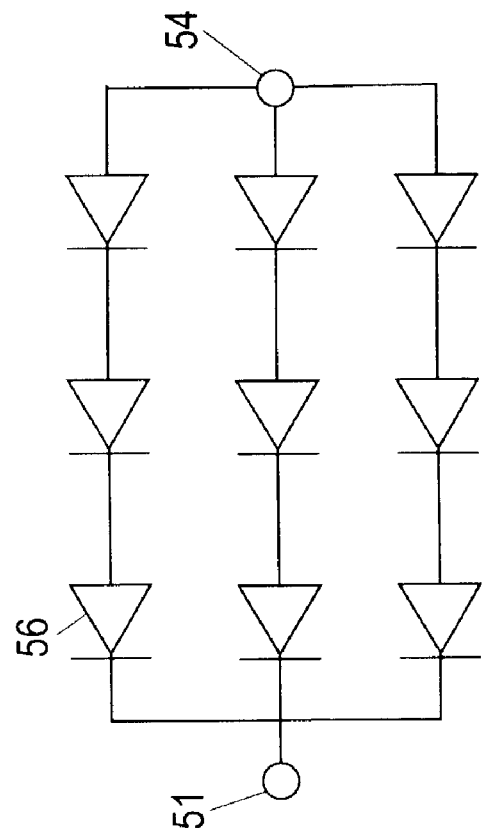
FIG. 10 is a circuit diagram for the lamp of FIG. 9.
Figure 9:
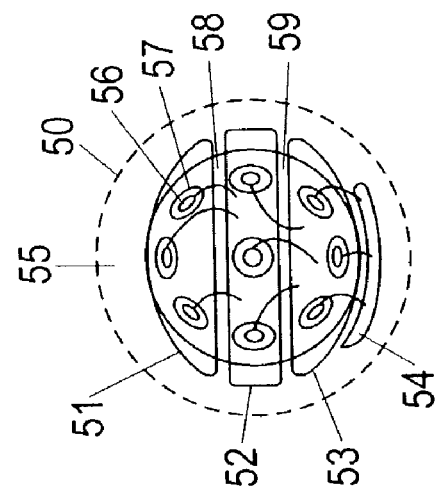
FIG. 9 is a plan view of a third lamp.

All of the conductors 23, 24, 26, 27 are preferably formed in a two dimensional lead frame structure 40 shown in FIG. 6, to allow ease of manufacture and reliability in directly trated in FIG. 10. Each of the conductors 51 to 54, in this instance, however, carrying three junctions 56.

The conductors 51 to 54 are curved within the globe portion 55 so as to support the junctions on an imaginary curved surface such as a spheroid and, in that manner, the illumination generated by the lamp 50 will have an appearance of emanating from a small, generally spheroid point like source. A lens 60 may also be provided for modifying the output of the junctions to produce a more even distribution pattern such as represented by curve C in FIG. 16, which is the illumination output observed from a plan view of the lamp 50, i.e. when the lamp is seen from the same direction as viewed in FIG. 9.

In addition to modifying the light output by using the lens 60, it is also possible to arrange the conductors in any desired configuration and the construction of the recesses 57 may also be used to assist in controlling the directional output of the light emitted from the various junctions. In particular, the configuration of each recess may be such that for example, the recess side walls act as optical guides to control the direction and/or angle of divergence of light emitted from each junction.

Figure 12:
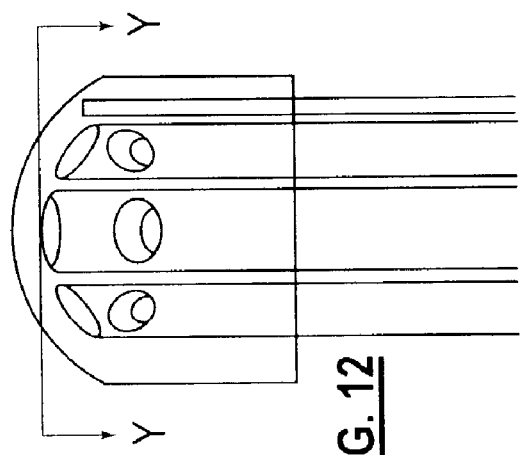
FIG. 12 is a side view of the lamp of FIG. 9.
Figure 11:
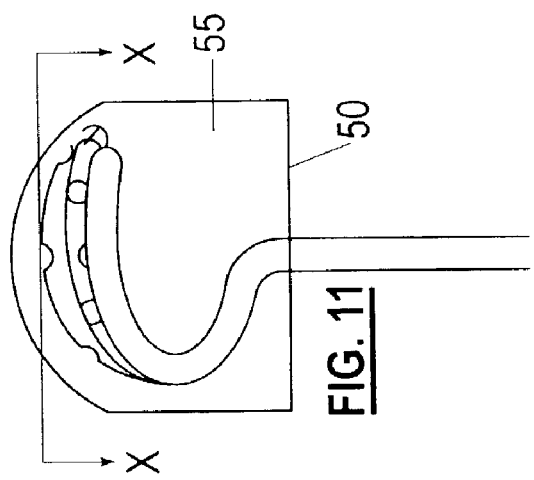
FIG. 11 is a front view of the lamp of FIG. 9.
Figure 14:
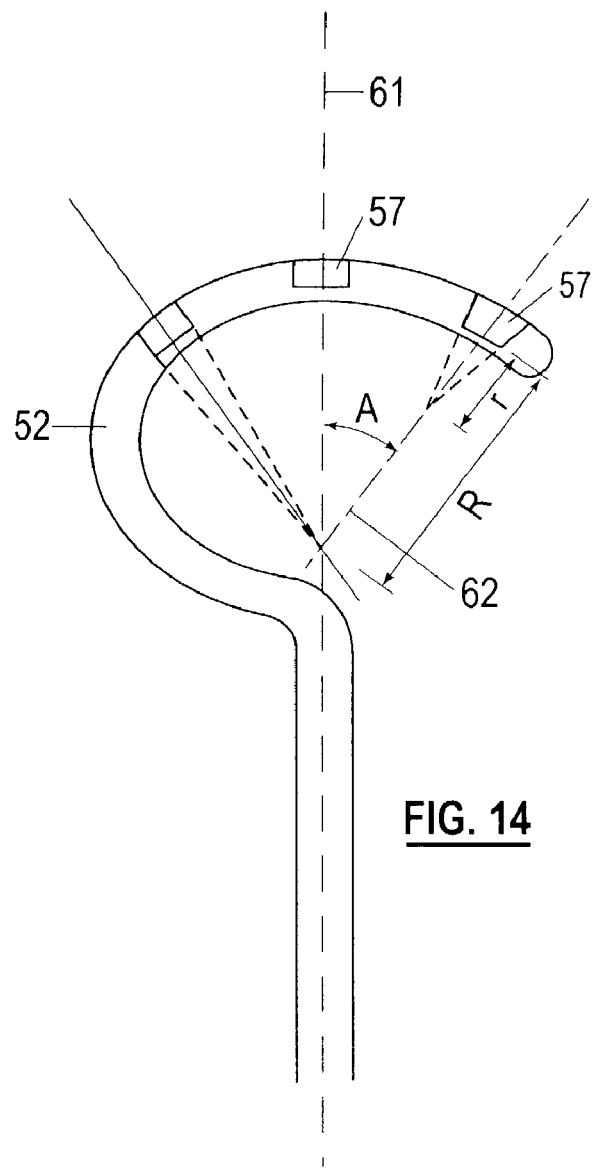
FIG. 14 is a cross-sectional view taken along the line X—X shown in FIG. 11.
Figure 15:
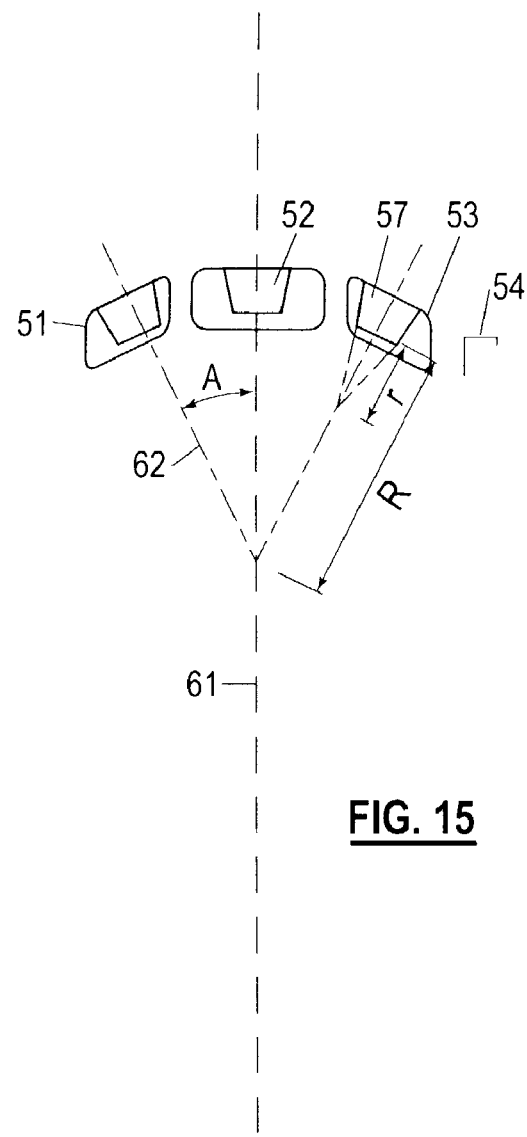
FIG. 15 is a cross-sectional view taken along the line Y—Y shown in FIG. 12.
Figure 16:
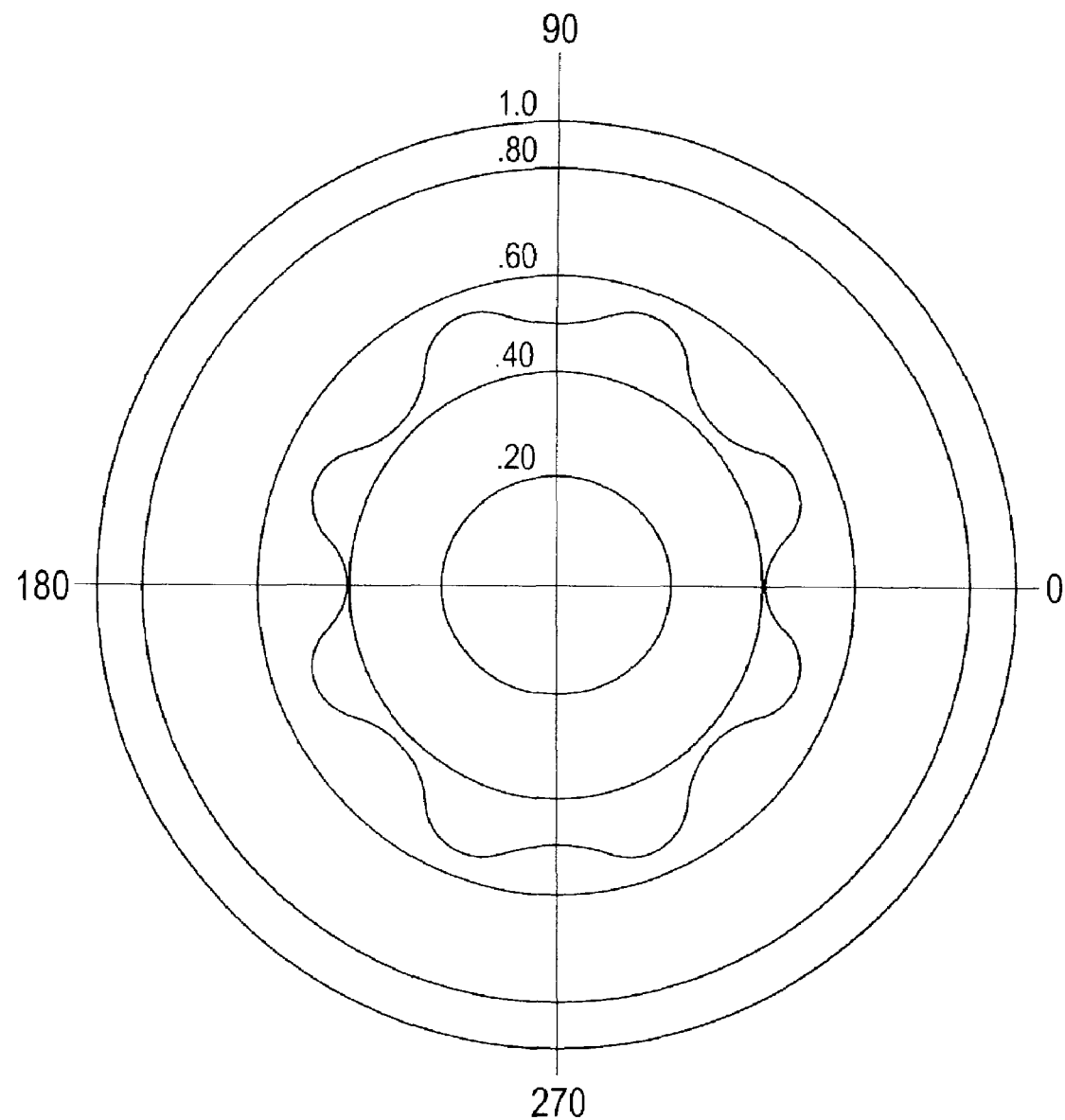
FIG. 16 is a representation of the illumination pattern produced by the lamp of FIGS. 9 to 12.
Figure 17:
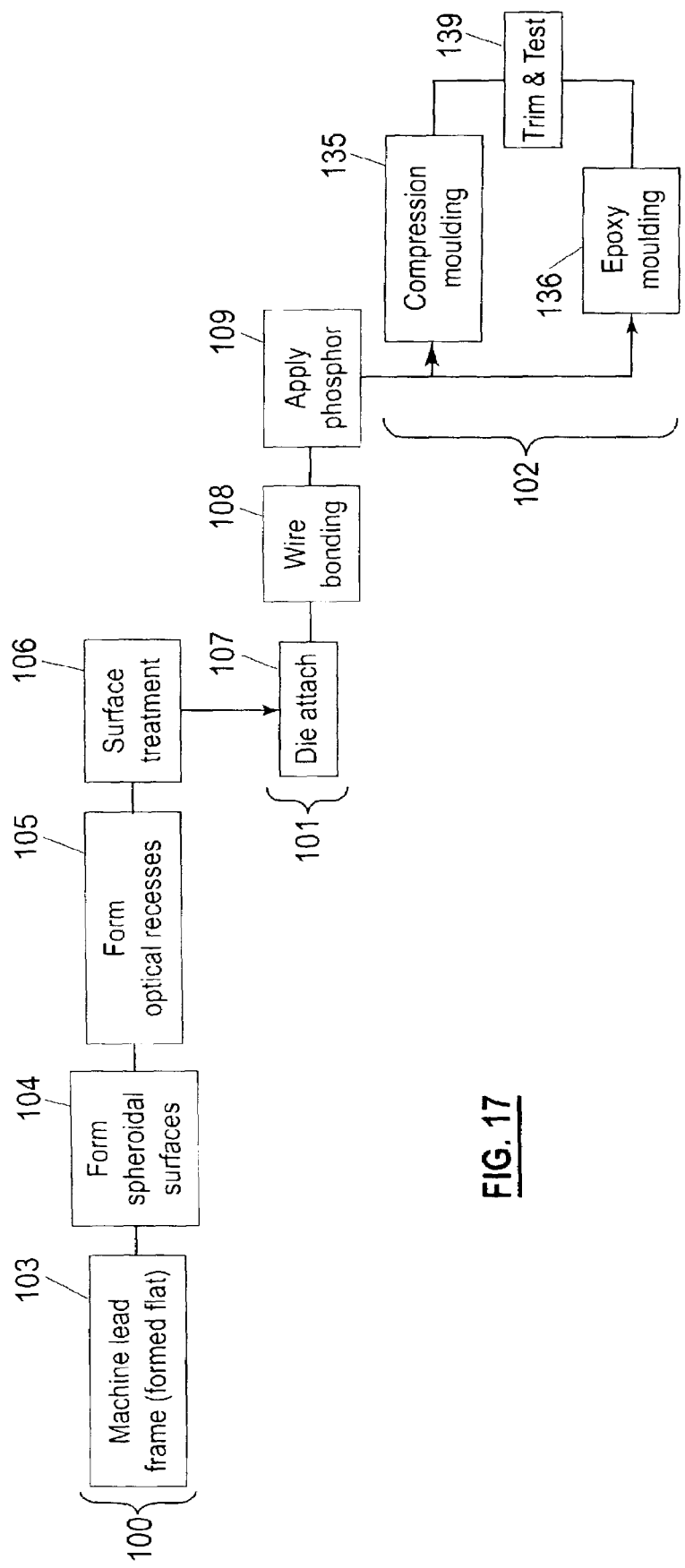
FIG. 17 is a schematic flow chart illustrating steps for producing a lamp.

More specifically, the shape of each recess and its effect on the light output from the junctions will now be described in more detail with reference to FIGS. 14 and 15, which show cross-sectional views of the relevant conductors taken along the lines X—X and Y—Y shown in FIGS. 11 and 12 respectively.

The recesses 57 containing the LED junctions are positioned and shaped in the conductors 51, 52, 53 so that the beams of light emerging from the recesses may be combined in free space outside the lamp 50 in predictable patterns determined by the radius of the imaginary part spherical surface designated 'R', the distance from the LED junction in the recess to the intersection of the imaginary extension of the sides of a recess—designated 'r' and the angle 'A' between the centre line 61 of the lamp 50 and a centre line 62 passing through the perpendicular to any other LED junction.

The radius 'R' of the imaginary spherical surface is the distance from the intersection of those centre lines to the LED junction within the recess. The angle between the sides of a recess determines the value of the 'r'.

In the limiting case where 'r' is equal to or greater than 'R', the light from each LED junction will be shaped by the recesses into beams which do not cross, regardless of the value of angle 'A'. For all values of 'r' less than 'R' it will be possible to have the light beam from each LED junction coincide with the edges of the light beams from adjacent LED junctions. The exact positioning in this instance will be determined by the ratio R/r and the value of angle 'A'.

As may be appreciated, the above described lamps allow considerable scope for obtaining a light source using junction diodes, with a predetermined one of a variety of output illumination patterns whilst maintaining a generally simple construction. A particular advantage is that the various junctions are of small size and may be configured to produce a light output which may be perceived by the naked eye to be emanating from a single point source of light.

A method of producing a lamp is now described, with reference to FIGS. 17 to 24. In an exemplary embodiment the method includes three main stages: stage 100 is the formation of a suitable lead frame; stage 101 is the attachment of junctions to the lead frame; and stage 102 is the final packaging stage.

Stage 100 includes provision of a flat lead frame, at step 103, formation of conductors of the lead frame into a part spherical surface, at step 104, and the formation of recesses in the conductors, at step 105, followed by surface treatment step 106.

Figure 18:
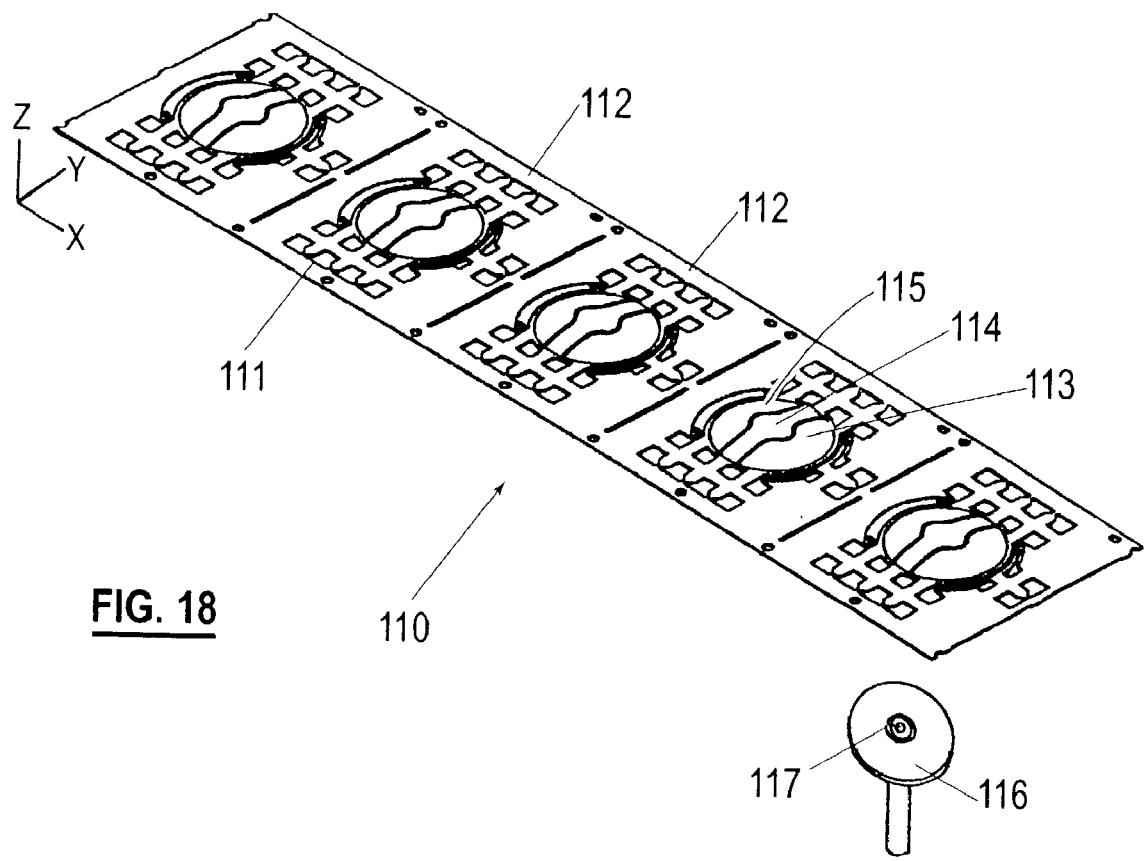
FIG. 18 is a diagrammatic perspective view of a lead frame arranged for a recess forming operation.

FIG. 18 shows a lead frame 110, between steps 104 and 105. The lead frame 110 is provided in a generally elongate strip 111, divided into sections 112, which will ultimately be separated to form individual lamps. Each section 112 includes a plurality of conductors 113, 114, 115 formed into a curved configuration which is preferably part spherical. The conductors may be formed in that configuration by any suitable process such as by inserting the strip 111 in a press or the like.

In order to form the recesses, the part spherical portion of the lead frame is fitted over a correspondingly shaped tool 116, at a forming station, where a punch (not shown) is engaged with the conductors 113, 114, 115, from an opposite side of the lead frame to that of the die, to form recesses in the conductors by action of the punch deforming the conductors into an associated die 117 provided in the tool 116. The recesses may be formed sequentially and for that purpose, the tool is preferably rotatably movable relative to the lead frame so that the die can be rotated to any desired position where a recess is required. In that manner, a single punch, which is rotated in unison, and die 117 can be used to form all of the recesses in any desired array. Alternatively, the tool 116 may have a predefined array of die 117 and the punch configured appropriately so that all of the recesses are formed in a single action. The particular positioning and configuration of the recesses can be selected to optimise output, as required, since the recesses act as optical guides, as discussed above specifically in relation to FIGS. 9 to 16, to define the directional output while the number of recesses will determine the maximum output intensity.

Figure 19:
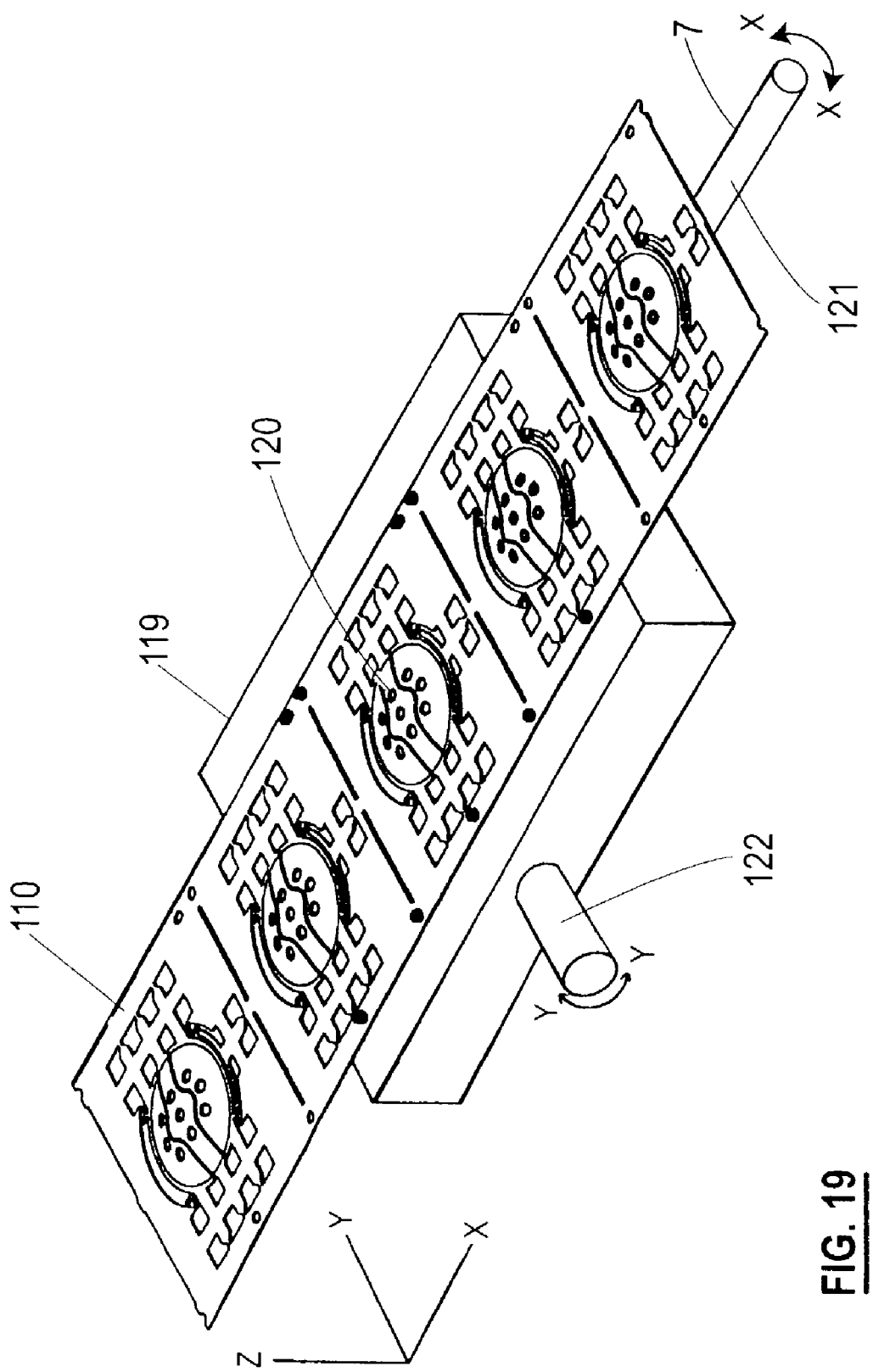
FIG. 19 is a perspective view of the lead frame on a carrier.
Figure 20:
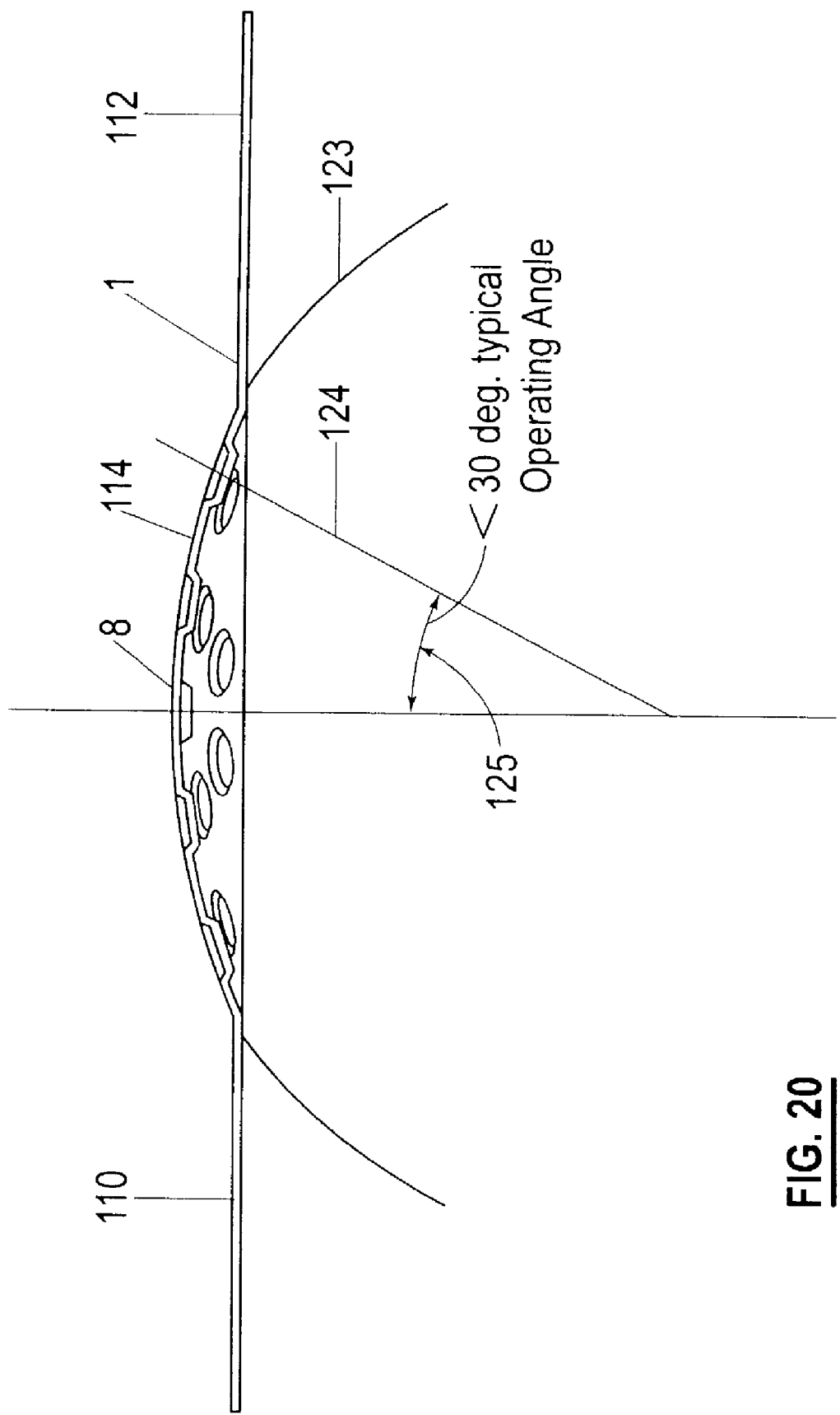
FIG. 20 is a cross-sectional view of the lead frame.

In any event, the lead frame 110, can be mounted on a carrier 119, as shown in FIG. 19, for stage 101, where light emitting junctions are mounted in the recesses 120. The carrier 119 is itself rotatable on a shaft 121, for pivotal movement about an x-axis, and a shaft 122, for pivotal movement about a y-axis. As such, the lead frame can be positioned at a mounting station (not shown) and rotated about the x,y axes relative to the mounting station in order for each one of the recesses 120 to be sequentially presented for receipt of an associated junction. FIG. 20 shows a cross-section of one of the stations 112 and, in particular, the part spherical configuration of conductor 114. A curve 123 represents the possible path of spherical translation of the conductor 114 which is achievable by rotating the lead frame 110 about axes 121,122. Line 124 represents an equivalent rotation of the tool 116 away from the z-axis, which in turn defines the operating angle 125 within which recesses 120 may be formed.

Figure 21A:
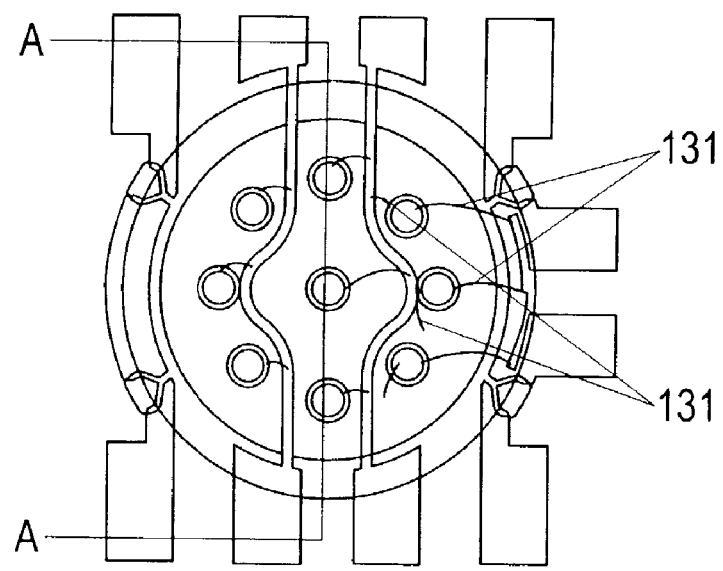
FIG. 21a) is a plan view of the lead frame with junctions and intermediate conductors attached.
Figure 21B:
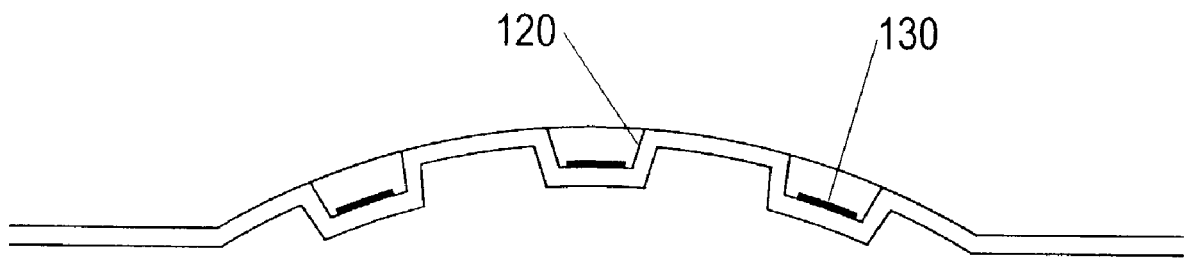
FIG. 21b) is a cross-sectional view of the lead frame, taken along the line A—A, shown in FIG. 21a).
Figure 22:
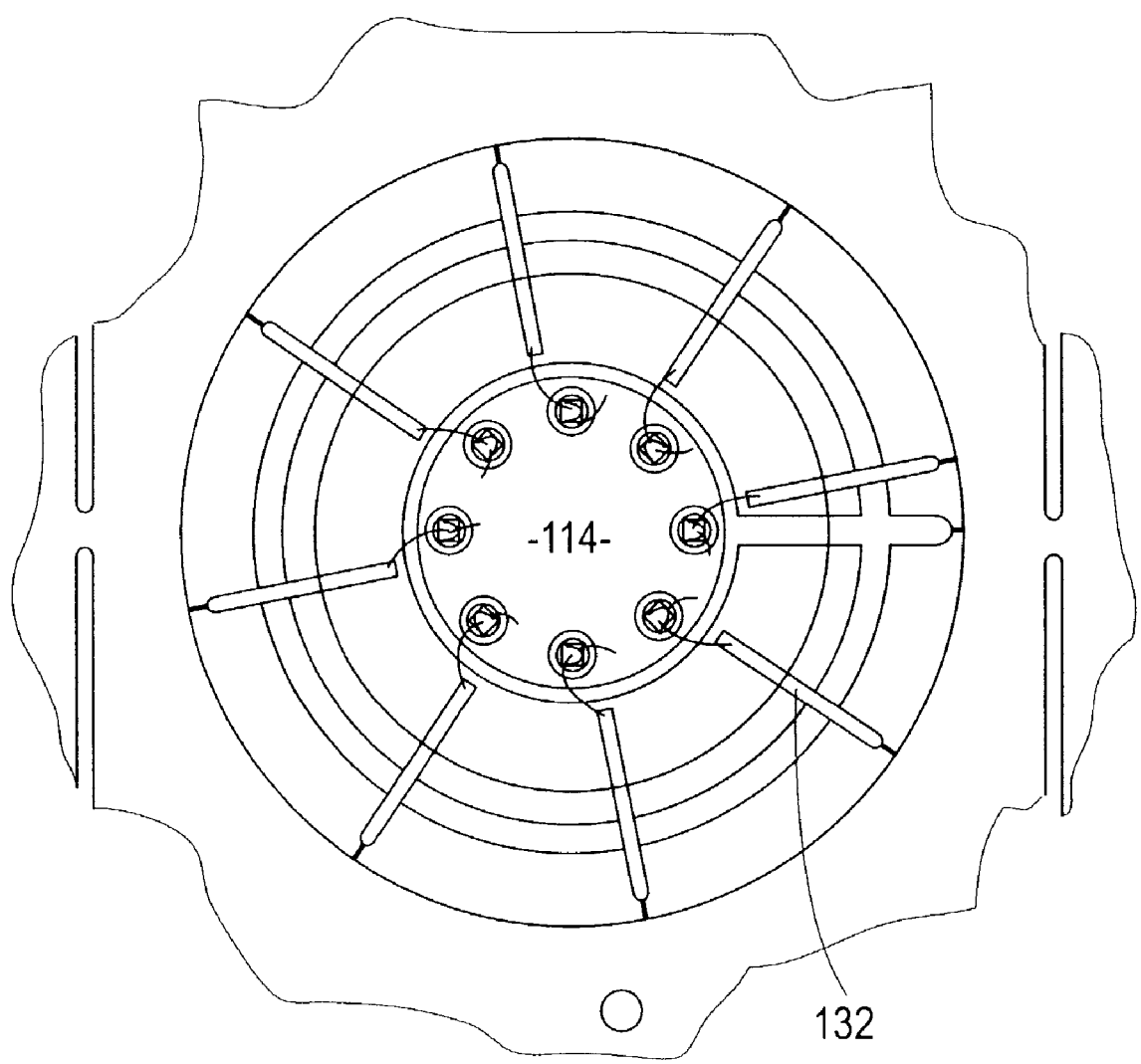
FIG. 22 is a plan view of another lead frame with junctions attached.
Figure 23:
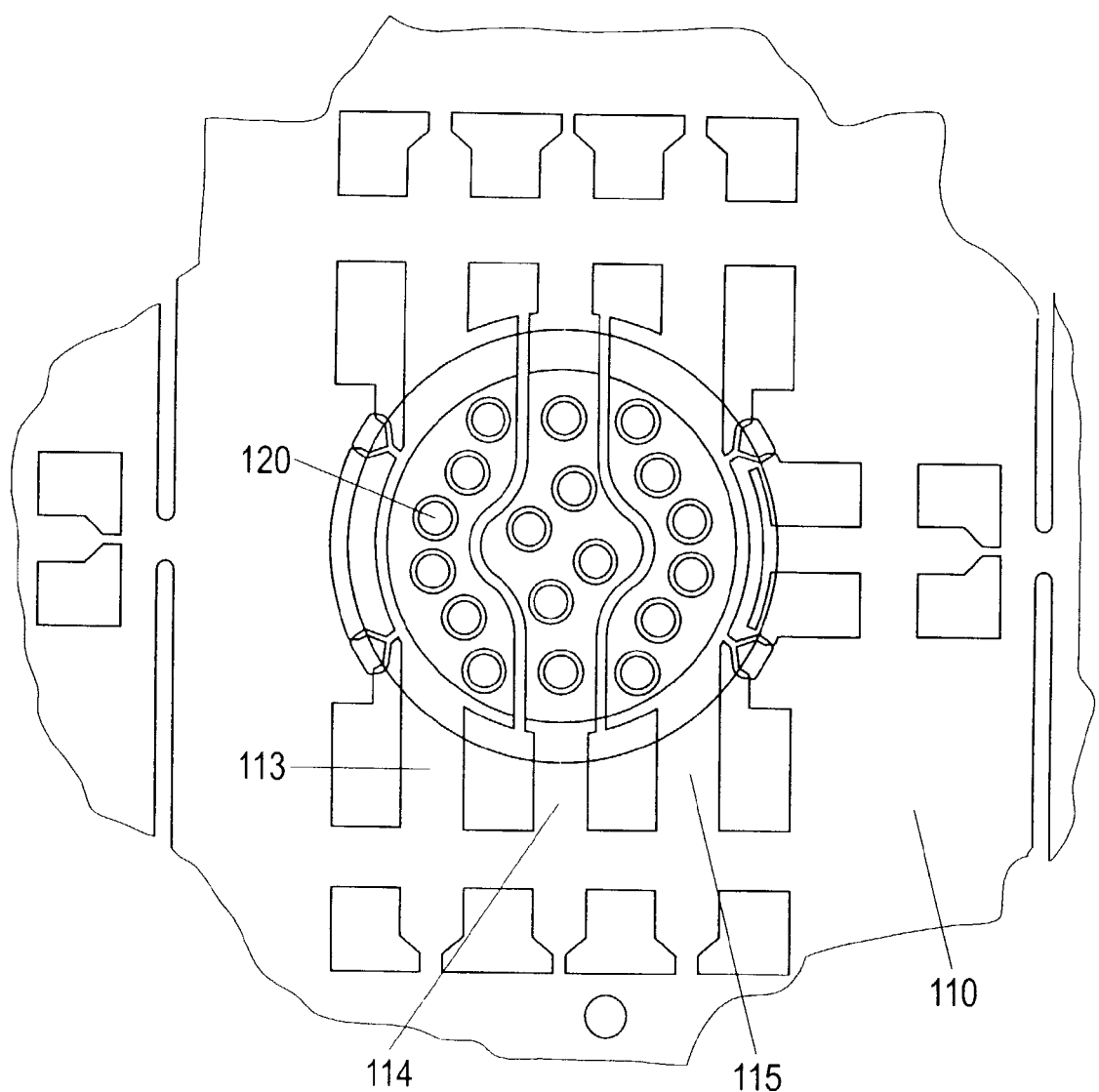
FIG. 23 is a plan view of an alternative lead frame construction.

When each of the recesses is appropriately presented at the mounting station, the associated light emitting device or die, referred to for simplicity as junction 130, as shown in FIG. 21, is inserted into the recess along a third axis, which is preferably in a z-axis direction, and bonded in place in accordance with step 107 of stage 101 of processing. At that time, or subsequent thereto, intermediate conductors 131 are attached at step 108 to electrically connect the junctions to adjacent conductors. The junctions shown in FIG. 21 are arranged in an electrically parallel configuration, however, the positioning and coupling of the junctions may be in any desired configuration, such as shown in FIG. 22, where each junction is coupled to a common central conductor 114 and a separate radially arranged conductor 132 to allow the light intensity from each of the junctions to be separately controlled by independently controlling the power supplied to the conductors. Another possible configuration of recesses 120 is shown in FIG. 23. In any of the configurations, various ones of the junctions can be electrically connected in groups so that the light intensity from each of the groups can be independently controlled.

Once the LED junctions have been mounted in place and the intermediate conductors connected, a phosphor is applied over the junctions at processing step 109 of stage 101. The phosphor is preferably applied to at least two adjacent LED junctions.

Figure 24:
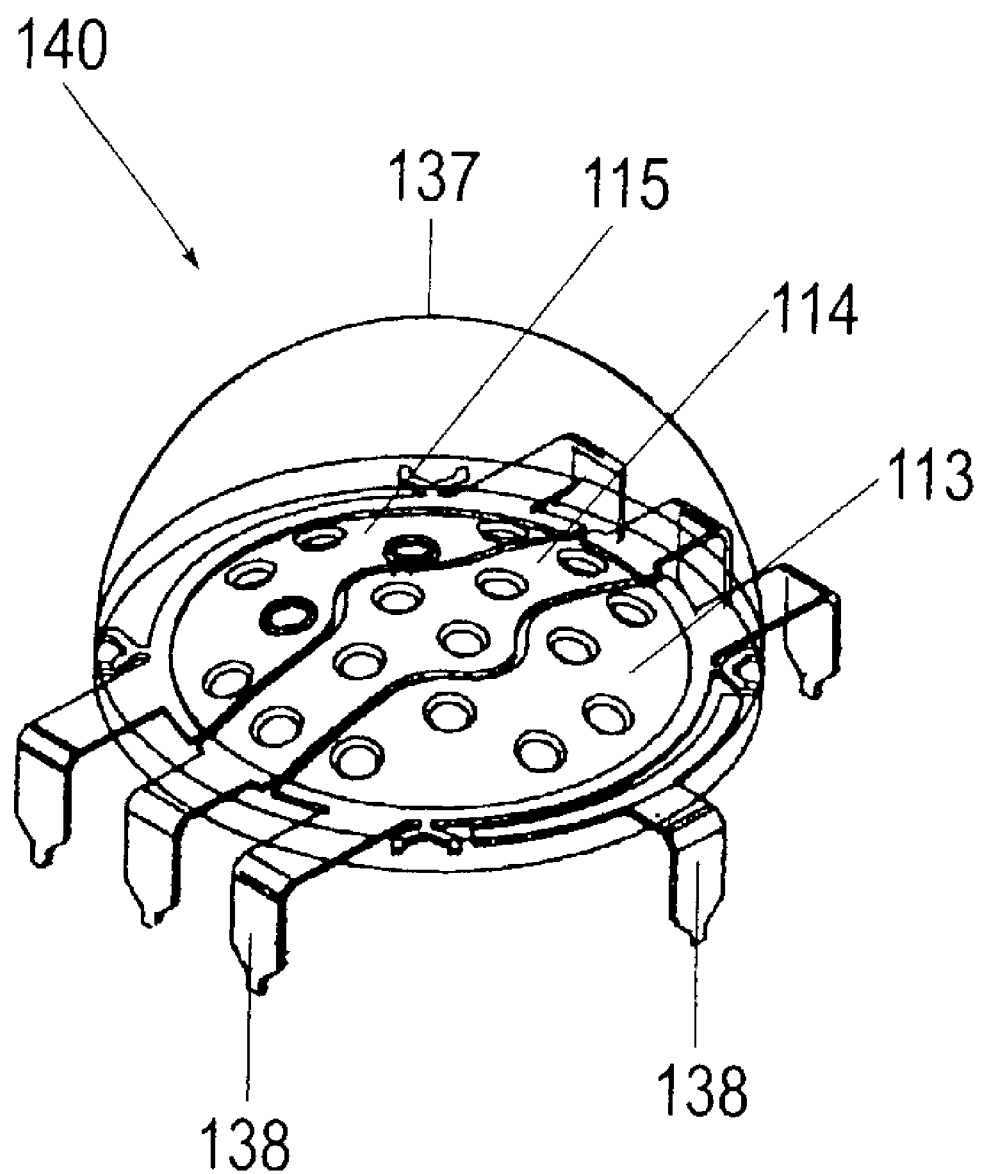
FIG. 24 is a perspective view of a lamp, formed from the lead frame of FIG. 23.

The lead frame 110 is then transferred to a final stage 102 of processing to form the lamp 140 shown in FIG. 24. Stage 102 includes separating the sections 112, removing excess lead frame material and either compression moulding, at step 135 or epoxy moulding, at step 136, a globe portion 137 (see FIG. 24) about the conductors 112, 114, 115. Free ends of the conductors may then be bent into terminals or pins 138, to be inserted in an associated through hole of a typical printed circuit board (PCB) or the like. The resultant lamp 140 may then be tested at step 139 and packaged, if required.

Figure 25:
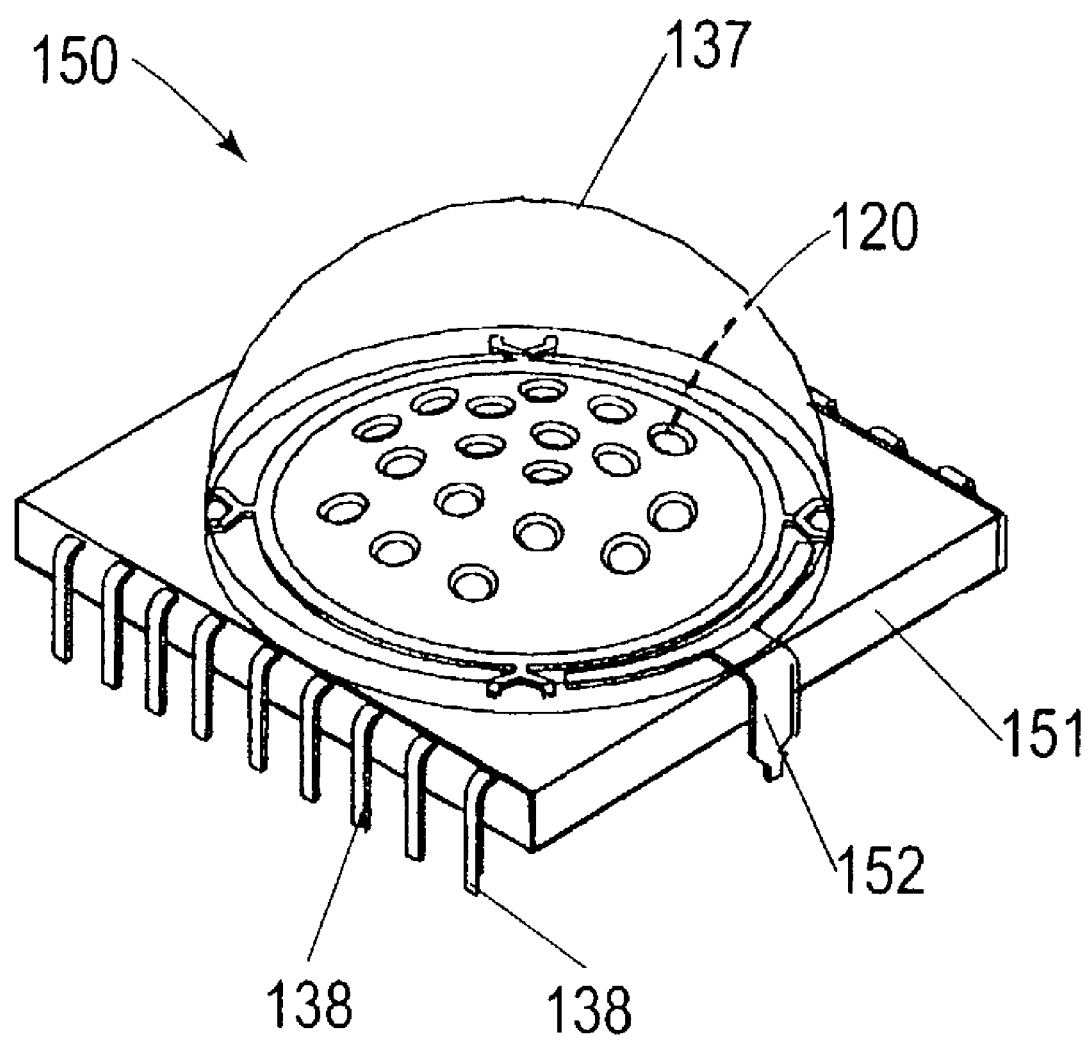
FIG. 25 is a perspective view of another lamp.

Another finished lamp 150 is shown in FIG. 25, with an additional moulded body 151 formed beneath the globe portion 137. In this instance, the conductors within the globe portion have not been shown for simplicity, however, the conductors may have a configuration similar to that shown in FIG. 22, albeit that more junctions and associated recesses and conductors are provided. Specifically, 18 separately wired junctions are provided, with 18 associated pins 138 and a further pin 152, for providing electric current to a common conductor within the globe portion 137. As such, 18 different circuits are formed within the lamp 150 and these can be individually addressed and controlled via the pins 138, which are again adapted to fit into PCB, or the like.

As may be appreciated then, the invention provides a method for producing an LED lamp which optimises output of the LED junctions by positioning the junctions in a three-dimensional array and utilising recesses for optical guides. Further, the construction allows different output of individual junctions or groups of junctions to be independently controlled to vary the intensity of emitted light. Lastly, it is again mentioned that the three-dimensional array of the junctions and the configuration of the curved conductors themselves allow for the light from the lamp to have more of an appearance of emanating from a single point or small spherical source, which may be considered an advantage over conventional discrete junction light emitting junction devices.

The above method and LED lamps have been described by way of non-limiting example only, and many modifications and variations may be made thereto without departing from the spirit and scope of the invention as hereinbefore described.

We claim:

1. A method of producing a lamp, comprising mounting light emitting junctions to one or more conductors, the one or more conductors having a plurality of recesses arranged therein so as to form a three-dimensional array of recesses, such that the light emitting junctions are located within the recesses.

2. The method of claim 1, wherein the one or more conductors constitute a non-planar support that provides said three-dimensional array.

3. The method of claim 2, wherein at least a portion of each of the one or more conductors is substantially spherical in shape.

4. The method of claim 1 further comprises locating the junctions in respective recesses formed in the support structure, the recesses functioning as an optical guide for controlling a direction of light output from the associated junction, wherein each of said recesses is adapted to function as an optical guide for controlling at least one of a direction and an angle of divergence of light output from a corresponding light emitting junction.

5. The method of claim 2, wherein the non-planar support comprises a lead frame.

6. The method of claim 1, further comprising the step of forming said plurality of recesses prior to mounting said light emitting junctions.

7. The method of claim 6, wherein the step of forming comprises engaging a punch and die with a lead frame to form said plurality of recesses.

8. The method of claim 7, wherein the recesses are formed in a single action.

9. The method of claim 7, wherein the recesses are formed sequentially, and the punch and die are moved relative to the lead frame after each recess forming step so that the punch and dies are appropriately positioned for a subsequent recess forming step.

10. The method of claim 5, further comprising supporting the lead frame on a carrier and moving the carrier so as to present each recess to a mounting station whereat the light emitting junctions are mounted in the recesses.

11. The method of claim 10, wherein the carrier is rotatable about first and second axes to align each recess with the mounting station for mounting of a corresponding junction.

12. The method of claim 1, including connecting intermediate conductors to form electrical connections between each junction and two associated conductors.

13. The method of claim 12, wherein the intermediate conductors are connected to allow for independent control of at least two of the junctions, by controlling electric current through the associated conductors, to which each junction is connected, including forming electrical connections between the light emitting junctions and the conductors to allow control of electrical current Through individual ones of the conductors so as to independently control light output from the one or more junctions coupled thereto.

14. The method of claim 13, wherein the junctions are electrically coupled to form groups of junctions electrically connected in series.

15. The method of claim 1, further comprising applying a common layer of fluorescent material over at least two adjacent junctions.

16. The method of claim 1, further comprising encapsulating the one or more conductors and junctions in a globe portion.

17. The method of claim 1, wherein the arrangement of said recesses is such that the junctions mounted therein are arranged on an imaginary substantially spheroid surface.

18. The method of claim 3, further comprising forming the one or more part-spherical conductors by deforming one or more substantially planar conductors.

19. The method of claim 12, wherein each junction mounted in a recess is electrically connected to the recess and to an adjacent conductor.

20. The method of claim 1, further comprising applying a common layer of fluorescent material over said junctions.

21. The method of claim 16, further comprising mounting a lens on the globe portion, the lens being configured to shape the light emitted from the globe portion into a predetermined pattern.

22. The method of claim 1, wherein the light emitting junctions and recesses are arranged so that light output from the lamp appears to emanate from a substantially point light source.

23. A method of producing a lamp, comprising forming a lead frame including a plurality of recesses for supporting light emitting junctions located within the plurality of recesses, said recesses being arranged in one or more conductors so as to form a three-dimensional array of recesses.

24. The method of claim 23, further comprising deforming contact pins of said lead frame and mounting said contact pins at corresponding mounting locations of a printed circuit board.

25. A method of producing a plurality of lamps, comprising forming a lead frame comprising a plurality of interconnected sections for respective lamps, each of said sections comprising a plurality of recesses for supporting light emitting junctions such that said light emitting junctions are located within said recesses, said recesses being arranged in one or more conductors so as to form a three-dimensional array of recesses.

26. The method of claim 25, further comprising mounting light emitting junctions in said recesses and dividing said lead frame to separate said sections and thereby provide a plurality of lead frame assemblies for respective lamps.

27. A method of producing a lamp, comprising mounting light emitting junctions in a three-dimensional array of respective recesses of an electrically conductive, non-planar support such that the light emitting junctions are arranged on an imaginary substantially spheroid surface and located within said recesses so that light output from the lamp appears to emanate from a substantially point light source.

28. The method of claim 27, wherein each of said recesses is adapted to function as an optical guide for controlling at least one of a direction and an angle of divergence of light output from a corresponding light emitting junction.

29. The method of claim 28, wherein said recesses are formed in one or more conductors of said ton-planar support, and the method further comprises forming electrical connections between the light emitting junctions and the one or more conductors to provide electrical current to said junctions.

30. The method of claim 28, wherein said recesses are formed in conductors of said non-planar support, and the method further comprises forming electrical connections between the light emitting junctions and the conductors to allow control of electrical current through individual ones of the conductors so as to independently control light output from the one or more junctions coupled thereto.

31. A method of producing a lamp, comprising:
mounting light emitting junctions in respective recesses formed in a support structure such that the junctions form a three-dimensional array, each recess functioning as an optical guide for controlling a direction of light output from an associated junction, and wherein the support structure is provided in the form of a lead frame so as to comprise a plurality of conductors; and
engaging a punch and die with the lead frame to form the recesses sequentially, the punch and die being moved relative to the lead frame after each recess forming action so that the punch and die are appropriately positioned for a subsequent recess forming action.

32. A method of producing a lamp, comprising:
mounting light emitting junctions in respective recesses formed in a support structure such that the junctions form a three-dimensional array, each recess functioning as an optical guide for controlling a direction of light output from an associated junction, and wherein the support structure is provided in the form of a lead frame so as to comprise a plurality of conductors;
engaging a punch and die with the lead frame to form the recesses; and
supporting the lead frame on a carrier and moving the carrier so as to present each recess to a mounting station whereat the junctions are mounted to the conductors.

33. The method of claim 32, wherein the carrier is rotatable about first and second orthogonal axes to align each recess with the mounting station, and the junctions are mounted in the recesses by advancing the junctions and associated conductors relative to each along a third axis.

34. A method of producing a lamp, comprising mounting light emitting junctions to bases of respective recesses of a non-planar support, the recesses being arranged in a three-dimensional array, such that the light emitting junctions are arranged on an imaginary substantially spheroid surface and located within said recesses so that light output from the lamp appears to emanate from a substantially point light source.

35. A method of producing a lamp, comprising mounting light emitting junctions in respective recesses of a non-planar support, the recesses being arranged in a three-dimensional array, such that the light emitting junctions are arranged on an imaginary substantially spheroid surface and located within said recesses so that light output from the lamp appears to emanate from a substantially point light source, the recesses having sidewalls and bases.

36. A method of producing a lamp, comprising mounting light emitting junctions in respective recesses of a non-planar support, the recesses being arranged in a three-dimensional array, a portion of said support extending across each of said recesses to support said light emitting junctions such that the light emitting junctions are arranged on an imaginary substantially spheroid surface and located within said recesses so that light output from the lamp appears to emanate from a substantially point light source.

* * * * *